US009773681B2

(12) United States Patent
Kumar et al.

(10) Patent No.: US 9,773,681 B2
(45) Date of Patent: Sep. 26, 2017

(54) SEMICONDUCTOR DEVICE WITH A TRENCH AND METHOD FOR MANUFACTURING THE SAME

(71) Applicant: Vanguard International Semiconductor Corporation, Hsinchu (TW)

(72) Inventors: Manoj Kumar, Dhanbad (IN);
Tsung-Hsiung Lee, Taoyuan (TW);
Pei-Heng Hung, New Taipei (TW);
Chia-Hao Lee, New Taipei (TW);
Jui-Chun Chang, Hsinchu (TW)

(73) Assignee: VANGUARD INTERNATIONAL SEMICONDUCTOR CORPORATION, Hsinchu (TW)

( * ) Notice: Subject to any disclaimer, the term of this patent is extended or adjusted under 35 U.S.C. 154(b) by 0 days.

(21) Appl. No.: 14/732,062

(22) Filed: Jun. 5, 2015

(65) Prior Publication Data

US 2016/0359040 A1     Dec. 8, 2016

(51) Int. Cl.
*H01L 21/31*     (2006.01)
*H01L 29/417*     (2006.01)
(Continued)

(52) U.S. Cl.
CPC ........ *H01L 21/31* (2013.01); *H01L 21/28518* (2013.01); *H01L 21/30604* (2013.01);
(Continued)

(58) Field of Classification Search
CPC .......... H01L 29/4236; H01L 29/66545; H01L 29/78; H01L 29/7813; H01L 29/7311;
(Continued)

(56) References Cited

U.S. PATENT DOCUMENTS 5,504,702 A * 4/1996 Sunaga ................. G11C 11/404
257/299
2006/0258072 A1* 11/2006 Kavalieros .......... H01L 29/7391
438/197
(Continued)

FOREIGN PATENT DOCUMENTS

TW     201241993 A1    10/2012
TW     201515217 A     10/2012

*Primary Examiner* — Marc Armand
*Assistant Examiner* — Shannon Yi
(74) *Attorney, Agent, or Firm* — Birch, Stewart, Kolasch & Birch, LLP

(57) ABSTRACT

A semiconductor device is provided. The semiconductor device includes a substrate; an epitaxial layer disposed over the substrate; a gate electrode disposed over the epitaxial layer; a source region and a drain region disposed in the epitaxial layer at opposite sides of the gate electrode; a trench extending from a top surface of the epitaxial layer through the source region into the epitaxial layer, wherein the trench has a slanted side and a bottom surface; and a first conductive-type linking region having the first conductive type, wherein the first conductive-type linking region surrounds the slanted side of the trench and contacts the bottom surface of the trench, wherein the first conductive-type linking region electrically connects the source region and the substrate. The present disclosure also provides a method for manufacturing this semiconductor device.

20 Claims, 6 Drawing Sheets

(51) Int. Cl.
*H01L 29/49* (2006.01)
*H01L 29/45* (2006.01)
*H01L 21/306* (2006.01)
*H01L 29/739* (2006.01)
*H01L 29/08* (2006.01)
*H01L 21/285* (2006.01)
*H01L 21/74* (2006.01)

(52) U.S. Cl.
CPC ........ *H01L 21/743* (2013.01); *H01L 29/0834* (2013.01); *H01L 29/41766* (2013.01); *H01L 29/45* (2013.01); *H01L 29/4975* (2013.01); *H01L 29/7391* (2013.01)

(58) Field of Classification Search
CPC .. H01L 29/732; H01L 29/735; H01L 29/7391
See application file for complete search history.

(56) References Cited

U.S. PATENT DOCUMENTS

| | | | |
|---|---|---|---|
| 2007/0096203 A1* | 5/2007 | Mouli | H01L 27/1027 257/330 |
| 2012/0280317 A1* | 11/2012 | Lee | H01L 29/0634 257/335 |
| 2014/0048878 A1* | 2/2014 | Xiao | H01L 29/7816 257/343 |
| 2015/0061007 A1* | 3/2015 | Yang | H01L 29/7802 257/337 |
| 2015/0236118 A1* | 8/2015 | Chan | H01L 29/6659 257/408 |
| 2015/0303207 A1* | 10/2015 | Liu | H01L 29/42336 257/316 |
| 2015/0348968 A1* | 12/2015 | Edwards | H01L 27/092 257/24 |

* cited by examiner

SEMICONDUCTOR DEVICE WITH A TRENCH AND METHOD FOR MANUFACTURING THE SAME

BACKGROUND

Technical Field

The disclosure relates to a semiconductor device and a method for manufacturing the same, and in particular to a semiconductor device with a trench and a method for manufacturing the same.

Description of the Related Art

The semiconductor integrated circuit industry has experienced rapid growth in the past several decades. Technological advances in semiconductor materials and design have produced increasingly smaller and more complex circuits. These material and design advances have been made possible as the technologies related to processing and manufacturing have also undergone technical advances. In the course of semiconductor evolution, the number of interconnected devices per unit of area has increased as the size of the smallest component that can be reliably created has decreased.

The semiconductor integrated circuit industry has produced numerous developments in effort to continue the scaling-down process. However, as the size of the smallest component has decreased, numerous challenges have arisen, such as the issue of reliability. Therefore, the existing semiconductor devices have not been satisfactory in every respect.

Therefore, a semiconductor device with improved reliability is needed.

SUMMARY

The present disclosure provides a semiconductor device, including: a substrate having a first conductive type; an epitaxial layer disposed over the substrate and having the first conductive type; a gate electrode disposed over the epitaxial layer; a source region and a drain region disposed in the epitaxial layer at opposite sides of the gate electrode, wherein the source region has the first conductive type and the drain region has a second conductive type, and the first conductive type is different from the second conductive type; a trench extending from a top surface of the epitaxial layer through the source region into the epitaxial layer, wherein the trench has a slanted side and a bottom surface; and a first conductive-type linking region having the first conductive type, wherein the first conductive-type linking region surrounds the slanted side of the trench and contacts the bottom surface of the trench, wherein the first conductive-type linking region electrically connects the source region and the substrate.

The present disclosure also provides a method for manufacturing a semiconductor device, including: providing a substrate having a first conductive type; forming an epitaxial layer over the substrate, wherein the epitaxial layer has the first conductive type; forming a gate electrode over the epitaxial layer; forming a source region and a drain region in the epitaxial layer at opposite sides of the gate electrode, wherein the source region has the first conductive type and the drain region has a second conductive type, and the first conductive type is different from the second conductive type; forming a trench extending from a top surface of the epitaxial layer through the source region into the epitaxial layer, wherein the trench has a slanted side and a bottom surface; and forming a first conductive-type linking region having the first conductive type, wherein the first conductive-type linking region surrounds the slanted side of the trench and contacts the bottom surface of the trench, wherein the first conductive-type linking region electrically connects the source region and the substrate.

A detailed description is given in the following embodiments with reference to the accompanying drawings.

BRIEF DESCRIPTION OF THE DRAWINGS

The disclosure may be more fully understood by reading the subsequent detailed description and examples with references made to the accompanying drawings, wherein.

DETAILED DESCRIPTION

Figure 1:
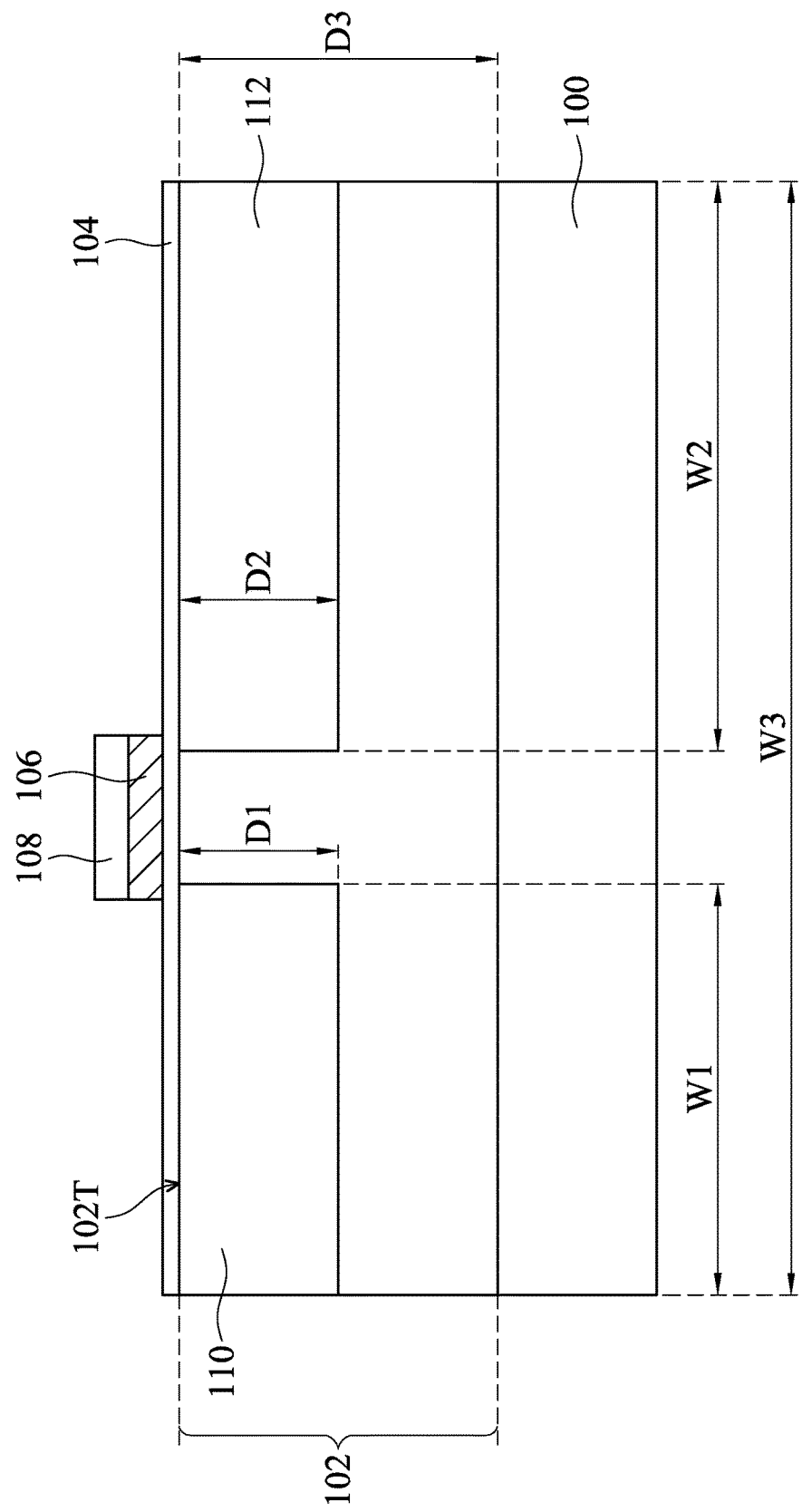
FIGS. 1-4 and 6 are cross-sectional views of an example semiconductor device at various manufacturing stages in accordance with some embodiments of the present disclosure.

The semiconductor device of the present disclosure and the method for manufacturing this semiconductor device are described in detail in the following description. In the following detailed description, for purposes of explanation, numerous specific details and embodiments are set forth in order to provide a thorough understanding of the present disclosure. The specific elements and configurations described in the following detailed description are set forth in order to clearly describe the present disclosure. It will be apparent, however, that the exemplary embodiments set forth herein are used merely for the purpose of illustration, and the inventive concept may be embodied in various forms without being limited to those exemplary embodiments. In addition, the drawings of different embodiments may use like and/or corresponding numerals to denote like and/or corresponding elements in order to clearly describe the present disclosure. However, the use of like and/or corresponding numerals in the drawings of different embodiments does not suggest any correlation between different embodiments. In addition, in this specification, expressions such as "first insulating bump disposed on/over a second material layer", may indicate the direct contact of the first insulating bump and the second material layer, or it may indicate a non-contact state with one or more intermediate layers between the first insulating bump and the second material layer. In the above situation, the first insulating bump may not directly contact the second material layer.

It should be noted that the elements or devices in the drawings of the present disclosure may be present in any form or configuration known to those skilled in the art. In addition, the expression "a layer overlying another layer", "a layer is disposed above another layer", "a layer is disposed on another layer" and "a layer is disposed over another layer" may indicate that the layer directly contacts the other layer, or that the layer does not directly contact the other layer, there being one or more intermediate layers disposed between the layer and the other layer.

In addition, in this specification, relative expressions are used. For example, "lower", "bottom", "higher" or "top" are used to describe the position of one element relative to another. It should be appreciated that if a device is flipped upside down, an element that is "lower" will become an element that is "higher".

The terms "about" and "substantially" typically mean +/−20% of the stated value, more typically +/−10% of the stated value, more typically +/−5% of the stated value, more typically +/−3% of the stated value, more typically +/−2% of the stated value, more typically +/−1% of the stated value and even more typically +/−0.5% of the stated value. The stated value of the present disclosure is an approximate value. When there is no specific description, the stated value includes the meaning of "about" or "substantially".

It should be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present disclosure.

Unless defined otherwise, all technical and scientific terms used herein have the same meaning as commonly understood by one of ordinary skill in the art to which this disclosure belongs. It should be appreciated that, in each case, the term, which is defined in a commonly used dictionary, should be interpreted as having a meaning that conforms to the relative skills and the background or the context of the present disclosure, and should not be interpreted in an idealized or overly formal manner unless so defined.

The term "substrate" is meant to include devices formed within a semiconductor wafer and the layers overlying the wafer. The term "substrate surface" is meant to include the uppermost exposed layers on a semiconductor wafer, such as silicon surface, and insulating layer and metallurgy lines.

The term "copper" will be understood to include copper and alloys thereof.

The semiconductor device provided in the present disclosure utilizes a trench with slanted side and a first conductive-type linking region surrounding it to ensure the electrical connection between the source region and the substrate, which in turn improves the reliability of the semiconductor device.

FIGS. 1-4 and 6 are cross-sectional views of an example semiconductor device at various manufacturing stages in accordance with some embodiments of the present disclosure. Referring to FIG. 1, a substrate 100 having a first conductive type is provided. The substrate 100 may include, but is not limited to, an element semiconductor substrate such as silicon or germanium with single-crystal structure, poly-crystal structure or amorphous structure, a compound semiconductor substrate which may include amorphous silicon, polycrystalline silicon, indium gallium zinc oxide, gallium nitride, silicon carbide, gallium arsenic, gallium phosphide, indium phosphide, indium arsenide or indium antimonide, an alloy semiconductor substrate which may include SiGe alloy, GaAsP alloy, AlInAs alloy, AlGaAs alloy, GaInAs alloy, GaInP alloy and/or GaInAsP alloy, or a combination thereof. In addition, the substrate 100 may include a semiconductor-on-insulator.

In some embodiments, the first conductive type is P-type, and the substrate 100 may be a heavily doped P-type substrate. In the described embodiments, the term "heavily doped" means an impurity concentration of above about $10^{19}/cm^3$, for example from about $10^{19}/cm^3$ to about $10^{21}/cm^3$. One skilled in the art will recognize, however, that "heavily doped" is a term of art that depends upon the specific device type, technology generation, minimum feature size, and the like. It is intended, therefore, that the term be interpreted in light of the technology being evaluated and not be limited to the described embodiments.

Referring to FIG. 1, an epitaxial layer 102 is formed over the substrate 100. The epitaxial layer 102 also is the first conductive type. The epitaxial layer 102 may include, but is not limited to, Si, Ge, Si/Ge, III-V compound, or a combination thereof. The epitaxial layer 102 may be formed by an epitaxial growth step, such as metalorganic chemical vapor deposition (MOCVD), metalorganic vapor phase epitaxy (MOVPE), plasma-enhanced chemical vapor deposition (PECVD), remote plasma-enhanced chemical vapor deposition (RP-CVD), molecular beam epitaxy (MBE), hydride vapor phase epitaxy (HVPE), liquid phase epitaxy (LPE), chloride vapor phase epitaxy (Cl-VPE), or any other suitable method.

In some embodiments, the first conductive type is P-type, and the epitaxial layer 102 having the first conductive type is a P-type epitaxial layer. The P-type epitaxial layer may be formed by adding borane ($BH_3$) or boron tribromide ($BBr_3$) into the reaction gas to perform in-situ doping when depositing the epitaxial layer 102. Alternatively, the un-doped epitaxial layer 102 may be deposited first, then the un-doped epitaxial layer 102 is ion-implanted by boron ion or indium ion. The doping concentration of the epitaxial layer 102 ranges from about $10^{17}/cm^3$ to about $10^{18}/cm^3$.

Next, a gate dielectric layer 104 and a conductive material layer (not shown, for forming the gate electrode 106) thereon may be blanketly deposited over the epitaxial layer 102. Subsequently, the gate electrode 106 over the gate dielectric layer 104 (or over the epitaxial layer 102) is formed from the conductive material layer by patterning this conductive material layer through photolithography and etching steps The material of the gate dielectric layer 104 may include, but is not limited to, silicon oxide, silicon nitride, silicon oxynitride, high-k material, any other suitable dielectric material, or a combination thereof. The high-k material may include, but is not limited to, metal oxide, metal nitride, metal silicide, transition metal oxide, transition metal nitride, transition metal silicide, transition metal oxynitride, metal aluminate, zirconium silicate, zirconium aluminate. For example, the material of the high-k material may include, but is not limited to, LaO, AlO, ZrO, TiO, $Ta_2O_5$, $Y_2O_3$, $SrTiO_3$(STO), $BaTiO_3$(BTO), BaZrO, $HfO_2$, $HfO_3$, HfZrO, HfLaO, HfSiO, HfSiON, LaSiO, AlSiO, HfTaO, HfTiO, HfTaTiO, HfAlON, (Ba,Sr)$TiO_3$(BST), $Al_2O_3$, any other suitable high-k dielectric material, or a combination thereof. The dielectric material layer may be formed by chemical vapor deposition or spin-on coating. The chemical vapor deposition may include, but is not limited to, low pressure chemical vapor deposition (LPCVD), low temperature chemical vapor deposition (LTCVD), rapid thermal chemical vapor deposition (RTCVD), plasma enhanced chemical vapor deposition (PECVD), atomic layer deposition (ALD), or any other suitable method.

The material of the conductive material layer (i.e. the material of the gate electrode 106) may include, but is not limited to, amorphous silicon, poly-silicon, one or more metal, metal nitride, conductive metal oxide, or a combination thereof. The metal may include, but is not limited to, molybdenum, tungsten, titanium, tantalum, platinum, or hafnium. The metal nitride may include, but is not limited to, molybdenum nitride, tungsten nitride, titanium nitride or tantalum nitride. The conductive metal oxide may include, but is not limited to, ruthenium oxide or indium tin oxide.

The conductive material layer may be formed by the previously described chemical vapor deposition (CVD), sputtering, resistive thermal evaporation, electron beam evaporation, or any other suitable methods. For example, in one embodiment, the amorphous silicon conductive material layer or poly-silicon conductive material layer may be deposited and formed by low-pressure chemical vapor deposition at about 525° C.~650° C. The thickness of the amorphous silicon conductive material layer or poly-silicon conductive material layer may range from about 1000 Å to 10000 Å.

Then, a metal silicidation step may optionally be performed to form a first silicide layer 108 at the top surface of the gate electrode 106. The first silicide layer 108 may further decrease the on-resistance of the device. The material of the first silicide layer 108 may include, but is not limited to, nickel silicide, cobalt silicide, tungsten silicide, titanium silicide, tantalum silicide, platinum silicide, erbium silicide or any other suitable metal silicide.

Subsequently, a source region 110 and a drain region 112 are formed in the epitaxial layer 102 at opposite sides of the gate electrode 106. The source region 110 is the first conductive type, whereas the drain region 112 is a second conductive type. The first conductive type is different from the second conductive type.

In some embodiments, the first conductive type is P-type, and the second conductive type is N-type. The source region 110 may be a heavily doped P-type source region with the doping concentration ranging from about $10^{17}/cm^3$ to about $10^{19}/cm^3$, whereas the drain region 112 may be a lightly doped N-type drain region with the doping concentration ranging from about $10^{15}/cm^3$ to about $10^{18}/cm^3$. Furthermore, the ratio of the doping concentration in the epitaxial layer 102 to the doping concentration of lightly doped N-type drain region may be greater than about 2 orders (100 times).

The source region 110 and the drain region 112 may be formed by ion implantation. For example, when the source region 110 is a P-type source region and the drain region 112 is an N-type drain region, the P-type source region 110 may be formed by doping the region in the epitaxial layer 102 used to form the P-type source region 110 by boron ion, indium ion or boron difluoride ions ($BF_2^+$). The N-type drain region 112 may be formed by doping the region in the epitaxial layer 102 used to form the N-type drain region 112 by phosphorus ion or arsenic ion.

In some embodiments, as shown in FIG. 1, the source region 110 and the drain region 112 extend from only a portion of the top surface 102T of the epitaxial layer 102 into the epitaxial layer 102. The width W1 of the source region 110 is smaller than the width W3 of the epitaxial layer 102, and the width W2 of the drain region 112 is also smaller than the width W3 of the epitaxial layer 102. In addition, in some embodiments, the source region 110 and the drain region 112 only extend into a portion of the epitaxial layer 102. In particular, the depth D1 of the source region 110 is smaller than the depth D3 of the epitaxial layer 102, and the depth D2 of the drain region 112 is also smaller than the depth D3 of the epitaxial layer 102. In addition, both of the source region 110 and the drain region 112 slightly extend into the epitaxial layer 102 under the gate electrode 106.

Figure 2:
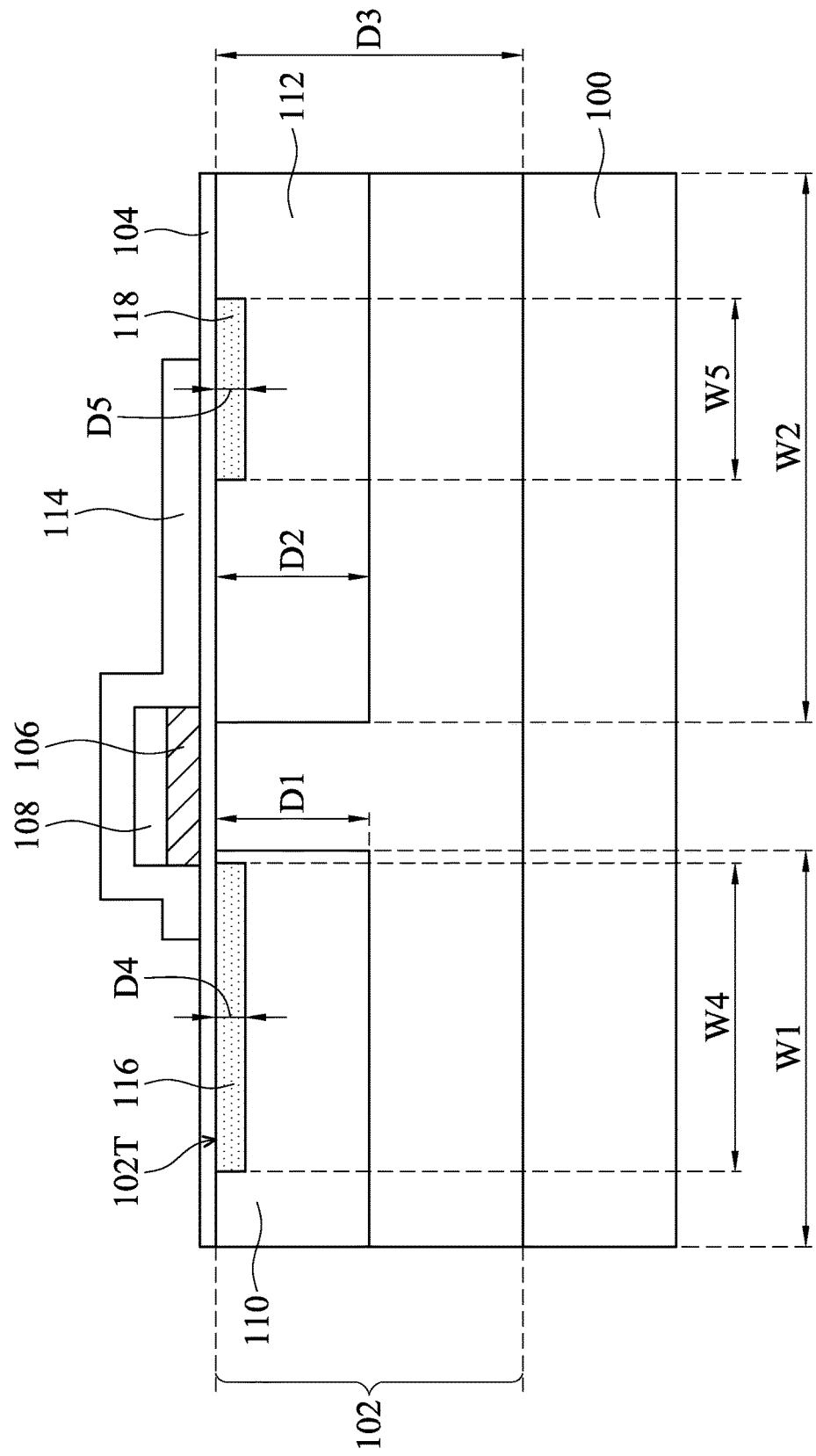

Next, referring to FIG. 2, a spacer layer 114 is conformally formed over the gate electrode 106 and over a portion of the source region 110 and the drain region 112. The material of the spacer layer 114 may include, but is not limited to, silicon oxide/silicon nitride/silicon oxide (ONO), silicon nitride/silicon oxide (NO), silicon oxide, silicon nitride, or any other suitable material, or a combination thereof. The spacer layer 114 may be formed by chemical vapor deposition such as low pressure chemical vapor deposition (LPCVD), low temperature chemical vapor deposition (LTCVD), rapid thermal chemical vapor deposition (RTCVD), plasma enhanced chemical vapor deposition (PECVD), atomic layer deposition (ALD), or any other suitable method.

Subsequently, a first heavily doped region 116 is formed in the source region 110, and a second heavily doped region 118 is formed in the drain region 112. The first heavily doped region 116 and the second heavily doped region 118 have the second conductive type. The first heavily doped region 116 and the second heavily doped region 118 may be formed by ion implantation. For example, in some embodiments, the second conductive type is N-type, and the first heavily doped region 116 and the second heavily doped region 118 may be formed by doping the region in the epitaxial layer 102 used to form these first heavily doped region 116 and the second heavily doped region 118 by phosphorus ion or arsenic ion.

Furthermore, the ratio of the doping concentration in the first heavily doped region 116 to the doping concentration of the source region 110 may be greater than about 2 orders (100 times). The doping concentration of the second heavily doped region 118 is greater than that of the drain region 112.

In some embodiments, as shown in FIG. 2, the first heavily doped region 116 extends from only a portion of the top surface 102T of the source region 110 into the epitaxial layer 102. The width W4 of the first heavily doped region 116 is smaller than the width W1 of the source region 110. In addition, in some embodiments, the first heavily doped region 116 only extends into a portion of the source region 110. In particular, the depth D4 of the first heavily doped region 116 is smaller than the depth D1 of the source region 110. In addition, the first heavily doped region 116 slightly extends into the epitaxial layer 102 under the spacer layer 114.

Similarly, in some embodiments, as shown in FIG. 2, the second heavily doped region 118 extends from only a portion of the top surface 102T of the drain region 112 into the epitaxial layer 102. The width W5 of the second heavily doped region 118 is smaller than the width W2 of the drain region 112. In addition, in some embodiments, the second heavily doped region 118 only extends into a portion of the drain region 112. In particular, the depth D5 of the second heavily doped region 118 is smaller than the depth D2 of the drain region 112. In addition, the second heavily doped region 118 slightly extends into the epitaxial layer 102 under the spacer layer 114.

In some embodiments, as shown in FIG. 2, the source region 110 completely surrounds the sides of the first heavily doped region 116 except for the top surface 102T. The drain region 112 completely surrounds the sides of the second heavily doped region 118 except for the top surface 102T.

Figure 3:
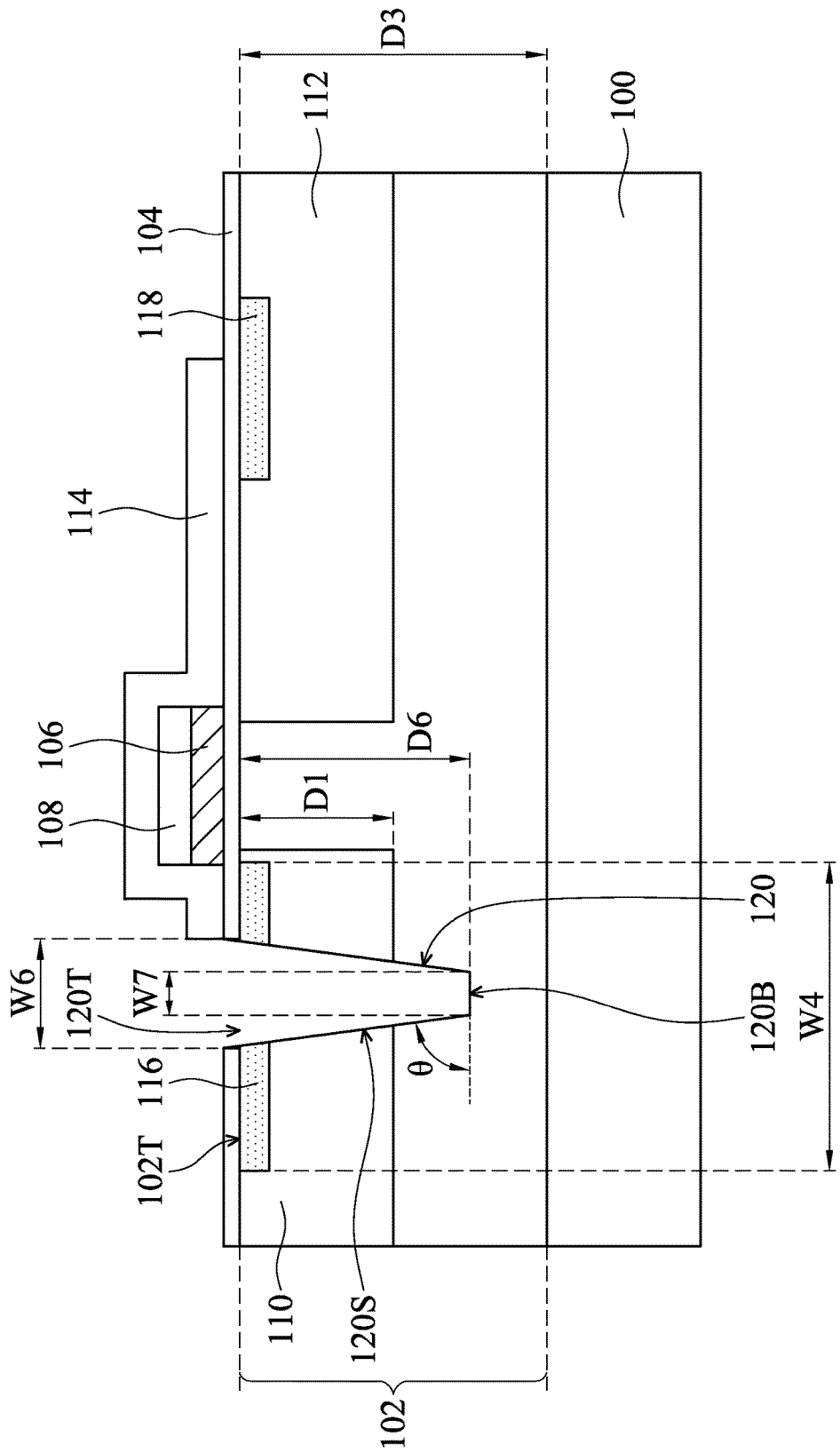

Next, referring to FIG. 3, a trench 120 is formed in the epitaxial layer 102. The trench 120 extends from the top surface 102T of the epitaxial layer 102 through the source region 110 into the epitaxial layer 102. More specifically, the trench 120 extends through the first heavily doped region 116 and the source region 110, and stop in the epitaxial layer 102. The trench 120 has a slanted side 120S and a bottom surface 120B, and the slanted side 120S intersects the bottom surface 120B at an acute angle θ, as shown in FIG. 3. In other words, the angle between the slanted side 120S and the bottom surface 120B is not 90 degrees.

In particular, the width W6 of the top portion 120T of the trench 120 (or the width W6 of the trench 120 at the same level as the top surface 102T of the epitaxial layer 102) is greater than the width W7 of the bottom surface 120B of the trench 120. In other words, the trench 120 has a tapered shape.

In some embodiments, as illustrated in FIG. 3, a portion of the epitaxial layer 102 is removed to form the trench 120. Removal of the portion of the epitaxial layer 102 may be accomplished by forming a patterned photoresist layer (not shown) over the epitaxial layer 102 to expose the portions of the epitaxial layer 102 which are to be removed. The patterned photoresist layer may be formed by photolithography, immersion lithography, ion-beam writing, or any other suitable methods. For example, photolithography may include, but is not limited to, spin-on coating, soft baking, exposure, post exposure baking, development, cleaning, drying and other suitable processes.

Then, the exposed portion of the epitaxial layer 102 may be removed by a dry etching process, a wet etching process, or a combination thereof to form the trench 120 with the slanted side 120S. For example, the wet etching process may include immersion etching or spray etching. The dry etching process may include capacitively coupled plasma etching, inductively-coupled plasma etching, helicon plasma etching, electron cyclotron resonance plasma etching, or any other suitable dry etching processes. The etching process may be stopped after a period of time to leave a portion of the epitaxial layer 102 remained. Therefore, only a portion of the epitaxial layer 102 is removed to form the trench 120, and the patterned photoresist layer (not shown) may be removed by a wet stripping process, plasma ashing, or a combination thereof.

In addition, in some embodiments as shown in FIG. 3, the trench 120 extends from a portion of the top surface 102T of the first heavily doped region 116 into the epitaxial layer 102. The greatest width W6 of the trench 120 is smaller than the width W4 of the first heavily doped region 116. In addition, in some embodiments, the trench 120 extends through the source region 110 and only extends into a portion of the epitaxial layer 102. In other words, the depth D6 of the trench 120 is greater than the depth D1 of the source region 110, but is smaller than the depth D3 of the epitaxial layer 102.

Figure 4:
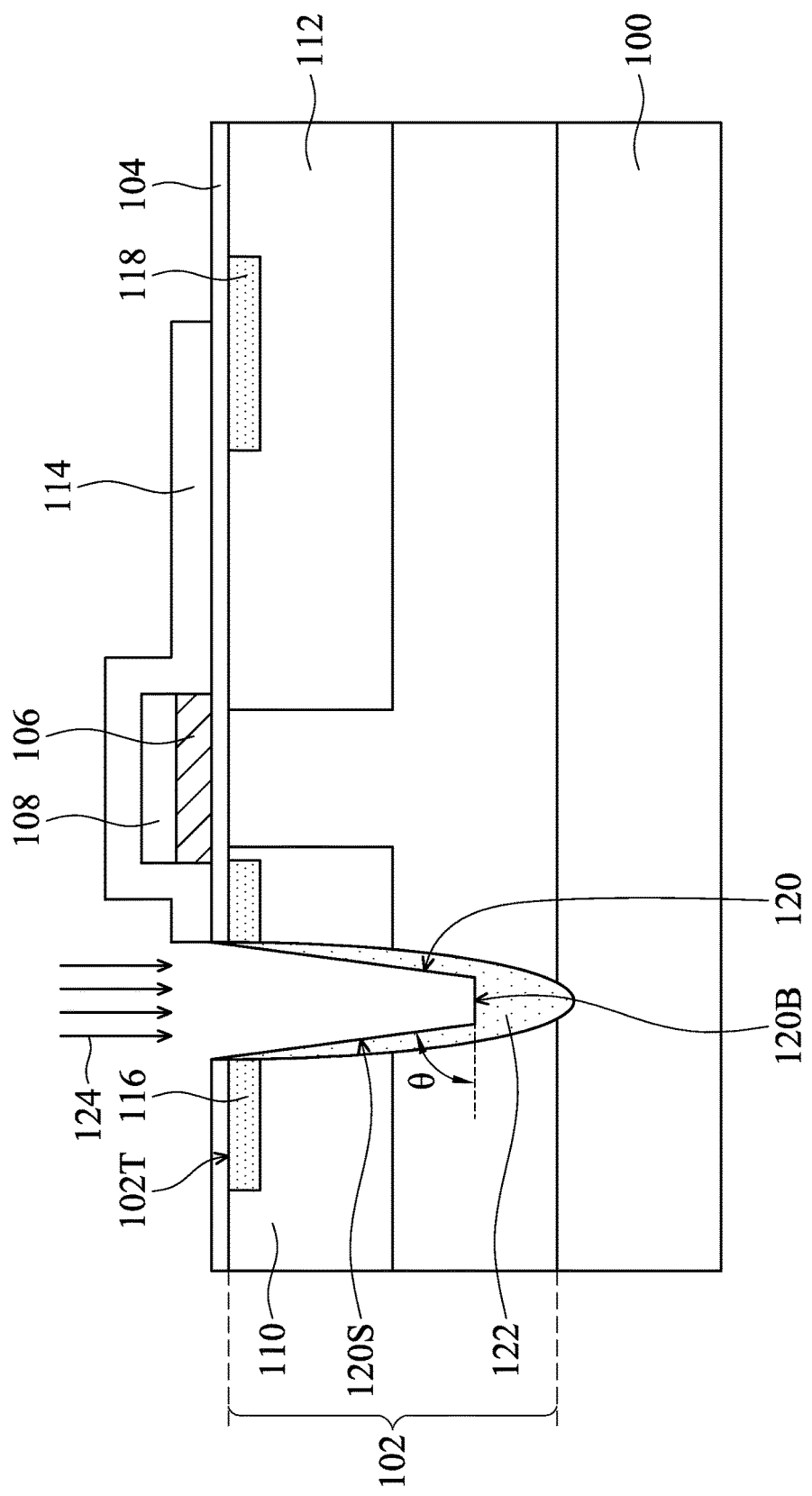

Next, referring to FIG. 4, a first conductive-type linking region 122 having the first conductive type is formed in the epitaxial layer 102 and the substrate 100. The first conductive-type linking region 122 may be formed by a doping process 124 which dopes the region of the epitaxial layer 102 corresponding to the trench 120. The doping concentration of the first conductive-type linking region 122 is greater than that of the source region 110 and the epitaxial layer 102. Since the trench 120 has the slanted side 120S, the first conductive-type linking region 122 may not only contact the bottom surface 120B of the trench 120 but also surround the slanted side 120S of the trench 120, thereby electrically connecting the substrate 100 and the source region 110, which is disposed adjoining the slanted side 120S of the trench 120.

Figure 5:
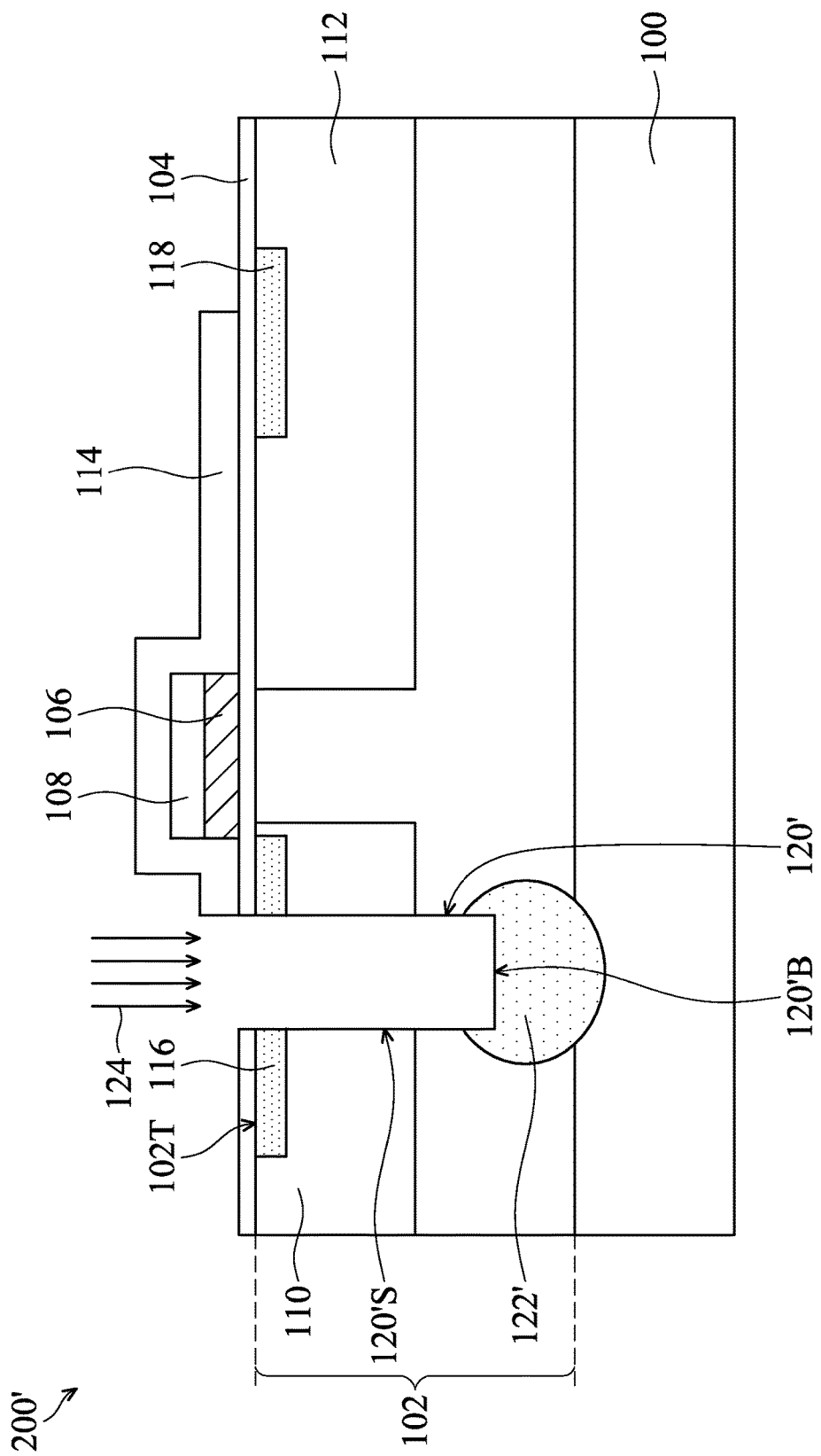
FIG. 5 is a cross-sectional view of a semiconductor device in accordance with another embodiment of the present disclosure.

FIG. 5 is a cross-sectional view of a semiconductor device 200' in accordance with another embodiment of the present disclosure. The difference between the embodiments shown in FIGS. 4 and 5 is that the semiconductor device in FIG. 5 has a trench with a vertical side rather than a slanted side. In other words, the vertical side 120'S of the trench 120' in FIG. 5 is orthogonal or vertical to the bottom surface 120'B. It should be noted that the same or similar elements or layers corresponding to those of the semiconductor device are denoted by like reference numerals. The same or similar elements or layers denoted by like reference numerals have the same meaning and will not be repeated for the sake of brevity.

As shown in FIG. 5, since the trench 120' has a vertical side 120'S rather than a slanted side, the first conductive-type linking region 122' cannot surround the entire vertical side 120'S and may not come into contact with the source region 110. Therefore, the source region 110 may not be electrically connected to the substrate 100 through the first conductive-type linking region 122' in FIG. 5, which in turn causes a reliability issue. This is also referred to as an unclamped inductive switching issue.

Compared to the embodiment shown in FIG. 5, since the trench 120 in FIG. 4 has the slanted side 120S, the first conductive-type linking region 122 may surround the entire slanted side 120S of the trench 120 and be in contact with the source region 110. Therefore, the source region 110 may be electrically connected to the substrate 100 through the first conductive-type linking region 122, which in turn improves the reliability of the device.

Still referring to FIG. 4, in some embodiments, the acute angle θ between the slanted side 120S and the bottom surface 120B may range from about 45 degrees to 88 degrees, for example from about 60 degrees to 70 degrees. It should be noted that, if the acute angle θ is too large, for example larger than 88 degrees, the first conductive-type linking region 122 may not effectively contact the source region 110. Therefore, the source region 110 may not electrically connect to the substrate 100 through the first conductive-type linking region 122, which in turn causes a reliability issue. However, if the acute angle θ is too small, for example smaller than 45 degrees, the trench 120 may occupy too much area in the semiconductor device and impede the process of reducing the scale of the semiconductor device.

In some embodiments, referring to FIG. 4, the first conductive-type linking region 122 extends from the source region 110 into the substrate 100. More specifically, in some embodiments, the first conductive-type linking region 122 extends from the top surface 102T of the epitaxial layer 102 into the substrate 100.

Figure 6:
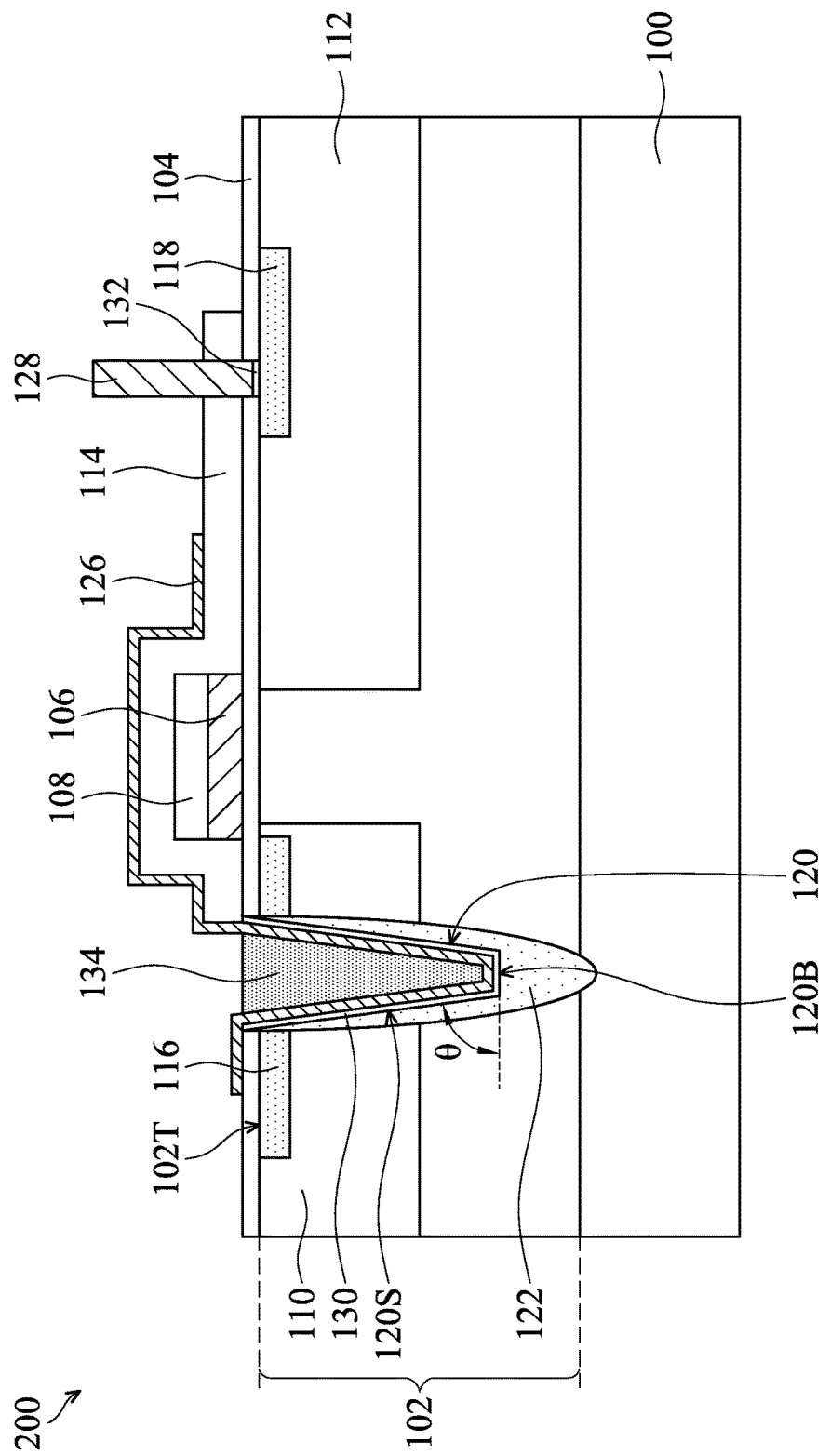

Next, referring to FIG. 6, a source contact 126 and a drain contact 128 are formed. The source contact 126 is electrically connected to the first heavily doped region 116 and the source region 110, and the drain contact 128 is electrically connected to the second heavily doped region 118 and the drain region 112.

The source contact 126 and the drain contact 128 may independently include, but is not limited to, copper, aluminum, molybdenum, tungsten, titanium, tantalum, platinum, or hafnium. The material of the source contact 126 and the drain contact 128 may be formed by the previously described chemical vapor deposition (CVD), sputtering, resistive thermal evaporation, electron beam evaporation, or any other suitable method.

Referring to FIG. 6, in some embodiments, the source contact 126 may be filled in the trench 120. The portion of the source contact 126 disposed in the trench 120 may conformally cover the slanted side 120S and the bottom surface 120B of the trench 120, as shown in FIG. 6.

Then, a metal silicidation step may optionally be performed to form a second silicide layer 130 between the source contact 126 and the trench 120, and form a third silicide layer 132 between the drain contact 128 and the second heavily doped region 118. In other words, the second silicide layer 130 is disposed between the portion of the source contact 126 in the trench 120 and the slanted side 120S and bottom surface 120B of the trench 120. The second silicide layer 130 and third silicide layer 132 may further decrease the on-resistance of the device.

The material of second silicide layer 130 and third silicide layer 132 may include, but is not limited to, nickel silicide, cobalt silicide, tungsten silicide, titanium silicide, tantalum silicide, platinum silicide, erbium silicide or any other suitable metal silicide.

Further, a dielectric layer 134 may be formed over the source contact 126 in the trench 120. The portion of the source contact 126 disposed in the trench 120 may be disposed between the dielectric layer 134 and the trench 120. The dielectric layer 134 may include, but is not limited to, silicon oxide, silicon nitride, silicon oxynitride, or any other suitable material, or a combination thereof. The spacer layer 114 may be formed by chemical vapor deposition such as low pressure chemical vapor deposition (LPCVD), low temperature chemical vapor deposition (LTCVD), rapid thermal chemical vapor deposition (RTCVD), plasma enhanced chemical vapor deposition (PECVD), atomic layer deposition (ALD), or any other suitable method.

Referring to FIG. 6, the semiconductor device 200 includes a substrate 100 having a first conductive type, an epitaxial layer 102 disposed over the substrate 100 and having the first conductive type, and a gate electrode 106 disposed over the epitaxial layer 102. The semiconductor device 200 further includes a source region 110 and a drain region 112 disposed in the epitaxial layer 102 at opposite sides of the gate electrode 106. The source region 110 has the first conductive type and the drain region 112 has a second conductive type, and the first conductive type is different from the second conductive type. The semiconductor device 200 further includes a trench 120 extending from the top surface 102T of the epitaxial layer 102 through the source region 110 into the epitaxial layer 102. The trench 120 has a slanted side 120S and a bottom surface 120B. The semiconductor device 200 further includes a first conductive-type linking region 122 having the first conductive type. The first conductive-type linking region 122 surrounds the slanted side 120S of the trench 120 and is in contact with the bottom surface 120B of the trench 120, and the first conductive-type linking region 122 electrically connects the source region 110 and the substrate 100. The slanted side 120S of the trench 120 intersects the bottom surface 120B of the trench 120 at an acute angle θ, and the acute angle θ ranges from about 45 degrees to 88 degrees.

The semiconductor device 200 may further include a first heavily doped region 116 disposed in the source region 110. The first heavily doped region 116 has the second conductive type, and the trench 120 may extend through the first heavily doped region 116 in the source region 110. The semiconductor device 200 may further include a second heavily doped region 118 disposed in the drain region 112, and the second heavily doped region 118 has the second conductive type.

The semiconductor device 200 may further include a source contact 126 filled in the trench 120 and electrically connected to the first heavily doped region 116 and the source region 110. The semiconductor device 200 may further include a drain contact 128 electrically connected to the second heavily doped region 118 and the drain region 112.

The semiconductor device 200 may further include a dielectric layer 134 disposed over the source contact 126 in the trench 120, and the portion of the source contact 126 disposed in the trench 120 is disposed between the dielectric layer 134 and the trench 120.

The semiconductor device 200 may further include a first silicide layer 108 disposed over the gate electrode 106, a second silicide layer 130 disposed between the source contact 126 and the trench 120, and a third silicide layer 132 disposed between the drain contact 128 and the second heavily doped region 118.

It should be noted that although the above description merely illustrates embodiments with the first conductive type being P-type and the second conductive type being N-type, those skilled in the art will appreciate that the first conductive type may be N-type with the second conductive type being P-type.

In summary, since the semiconductor device of the present disclosure has a trench with a slanted side, the first conductive-type linking region may surround the slanted side of the trench and contact the source region. Therefore, the source region may effectively be electrically connected to the substrate through the first conductive-type linking region, which in turn improves the reliability of the device.

Although some embodiments of the present disclosure and their advantages have been described in detail, it should be understood that various changes, substitutions and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A semiconductor device, comprising:
a substrate having a first conductive type;
an epitaxial layer disposed over the substrate and having the first conductive type;
a gate electrode disposed over the epitaxial layer;
a source region and a drain region disposed in the epitaxial layer at opposite sides of the gate electrode, wherein the source region has the first conductive type and the drain region has a second conductive type, and the first conductive type is different from the second conductive type, wherein a doping concentration of a first conductive type dopant of the source region is higher than a doping concentration of a second conductive type dopant of the drain region;
a trench extending from a top surface of the epitaxial layer through the source region into the epitaxial layer, wherein the trench has a slanted side and a bottom surface; and
a first conductive-type linking region, wherein the first conductive-type linking region is a doped region in the epitaxial layer and the substrate and has the first conductive type, wherein the first conductive-type linking region surrounds the slanted side of the trench and contacts the bottom surface of the trench, wherein the first conductive-type linking region electrically connects the source region and the substrate.

2. The semiconductor device as claimed in claim 1, wherein the slanted side of the trench intersects the bottom surface of the trench at an acute angle, wherein the acute angle ranges from about 45 degrees to 88 degrees.

3. The semiconductor device as claimed in claim 1, wherein a top portion of the trench has a greater width than the bottom surface of the trench.

4. The semiconductor device as claimed in claim 1, wherein the first conductive-type linking region extends from the source region into the substrate.

5. The semiconductor device as claimed in claim 1, further comprising:
   a first heavily doped region disposed in the source region, wherein the first heavily doped region has the second conductive type; and
   a second heavily doped region disposed in the drain region, wherein the second heavily doped region has the second conductive type,
   wherein the trench extends through the first heavily doped region in the source region.

6. The semiconductor device as claimed in claim 1, further comprising:
   a first silicide layer disposed over the gate electrode.

7. The semiconductor device as claimed in claim 4, wherein the first conductive-type linking region extends from the top surface of the epitaxial layer into the substrate.

8. The semiconductor device as claimed in claim 5, further comprising:
   a source contact filled in the trench and electrically connected to the first heavily doped region and the source region; and
   a drain contact electrically connected to the second heavily doped region and the drain region.

9. The semiconductor device as claimed in claim 8, wherein
   a portion of the source contact disposed in the trench conformally covers the slanted side and the bottom surface of the trench,
   wherein the semiconductor device further comprises a dielectric layer disposed over the source contact in the trench, wherein the portion of the source contact disposed in the trench is disposed between the dielectric layer and the trench.

10. The semiconductor device as claimed in claim 8, further comprising:
    a second silicide layer disposed between the source contact and the trench; and
    a third silicide layer disposed between the drain contact and the second heavily doped region.

11. A method for manufacturing a semiconductor device, comprising:
    providing a substrate having a first conductive type;
    forming an epitaxial layer over the substrate, wherein the epitaxial layer has the first conductive type;
    forming a gate electrode over the epitaxial layer;
    forming a source region and a drain region in the epitaxial layer at opposite sides of the gate electrode, wherein the source region has the first conductive type and the drain region has a second conductive type, and the first conductive type is different from the second conductive type, wherein a doping concentration of a first conductive type dopant of the source region is higher than a doping concentration of a second conductive type dopant of the drain region;
    forming a trench extending from a top surface of the epitaxial layer through the source region into the epitaxial layer, wherein the trench has a slanted side and a bottom surface; and
    forming a first conductive-type linking region, wherein the first conductive-type linking region is a doped region in the epitaxial layer and the substrate and has the first conductive type, wherein the first conductive-type linking region surrounds the slanted side of the trench and contacts the bottom surface of the trench, wherein the first conductive-type linking region electrically connects the source region and the substrate.

12. The method for manufacturing the semiconductor device as claimed in claim 11, wherein the slanted side of the trench intersects the bottom surface of the trench at an acute angle, wherein the acute angle ranges from about 45 degrees to 88 degrees.

13. The method for manufacturing the semiconductor device as claimed in claim 11, wherein a top portion of the trench has a greater width than the bottom surface of the trench.

14. The method for manufacturing the semiconductor device as claimed in claim 11, wherein the first conductive-type linking region extends from the source region into the substrate.

15. The method for manufacturing the semiconductor device as claimed in claim 11, further comprising:
    forming a first heavily doped region in the source region, wherein the first heavily doped region has the second conductive type; and
    forming a second heavily doped region in the drain region, wherein the second heavily doped region has the second conductive type,
    wherein the trench extends through the first heavily doped region in the source region.

16. The method for manufacturing the semiconductor device as claimed in claim 11, further comprising:
    forming a first silicide layer disposed over the gate electrode.

17. The method for manufacturing the semiconductor device as claimed in claim 14, wherein the first conductive-type linking region extends from the top surface of the epitaxial layer into the substrate.

18. The method for manufacturing the semiconductor device as claimed in claim 15, further comprising:
    forming a source contact filled in the trench and electrically connected to the first heavily doped region and the source region; and
    forming a drain contact electrically connected to the second heavily doped region and the drain region.

19. The method for manufacturing the semiconductor device as claimed in claim 18, wherein
    a portion of the source contact disposed in the trench conformally covers the slanted side and the bottom surface of the trench,
    wherein the method for manufacturing the semiconductor device further comprises forming a dielectric layer over the source contact in the trench, wherein the portion of the source contact disposed in the trench is disposed between the dielectric layer and the trench.

20. The method for manufacturing the semiconductor device as claimed in claim 18, further comprising:
    forming a second silicide layer between the source contact and the trench; and forming a third silicide layer between the drain contact and the second heavily doped region.

* * * * *